(12) United States Patent
Hiyoshi

(10) Patent No.: US 6,226,411 B1
(45) Date of Patent: May 1, 2001

(54) METHOD FOR DATA COMPRESSION AND RESTORATION

(75) Inventor: Kiyomitsu Hiyoshi, Shizuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/917,383

(22) Filed: Aug. 26, 1997

(30) Foreign Application Priority Data

Jan. 31, 1997 (JP) .................................................... 9-018658

(51) Int. Cl.$^7$ .............................. G06K 9/36; G06T 17/00
(52) U.S. Cl. ........................................... 382/232; 345/428
(58) Field of Search ..................................... 711/137, 126, 711/204, 213, 162; 395/383, 200.77; 364/708.1, 260.6, 285.4, 256.1, 918.2, 918; 382/137, 116, 305, 306, 232, 233, 234, 235, 276, 302, 303, 304, 307, 309, 312; 235/379; 340/825.3; 348/394, 403, 407, 420; 358/403; 345/349, 353; 707/104

(56) References Cited

U.S. PATENT DOCUMENTS

| | | | | |
|---|---|---|---|---|
| Re. 33,316 | * | 8/1990 | Katsuta et al. | 382/305 |
| 4,996,714 | * | 2/1991 | Desjardins et al. | 382/305 |
| 5,033,106 | * | 7/1991 | Kita | 382/305 |
| 5,172,245 | * | 12/1992 | Kita et al. | 382/305 |
| 5,206,915 | * | 4/1993 | Kern et al. | 382/305 |
| 5,287,497 | * | 2/1994 | Behera | 382/305 |
| 5,313,604 | * | 5/1994 | Godwin | 382/305 |
| 5,457,643 | * | 10/1995 | Vahey et al. | 364/708.1 |

FOREIGN PATENT DOCUMENTS

| | | | |
|---|---|---|---|
| 1-263825 | 10/1989 | (JP) | G06F/9/06 |
| 3-097026 | 4/1991 | (JP) | G06F/7/24 |
| 6-337762 | 12/1994 | (JP) | G06F/3/06 |
| 7-239771 | 9/1995 | (JP) | G06F/5/00 |

* cited by examiner

Primary Examiner—Phuoc Tran
Assistant Examiner—Duy N. Dang
(74) Attorney, Agent, or Firm—Staas & Halsey LLP

(57) ABSTRACT

The object is to improve data compression efficiency and to save disc space during a sort-merge operation. It provides a method for compressing a file having a plurality of n records each consisting of a plurality of m columns and created in a predetermined format, including the steps of: searching for one or more column locations in which the data is the same throughout the records; calculating the number of records which can be compressed in the file based on the number of the found column locations; determining a first record group consisting of records to be compressed and a second record group consisting of one or more records to be excluded based on the calculated number of records which can be compressed; determining a first record from the first record group, the first record data being kept the same; memorizing the addresses of the found column locations in a second record selected from the first record group, the second record being different from the first record; and transferring data stored in other column locations in the one or more records in the second record group to the column locations in records in the first record group except the first and the second records.

18 Claims, 15 Drawing Sheets

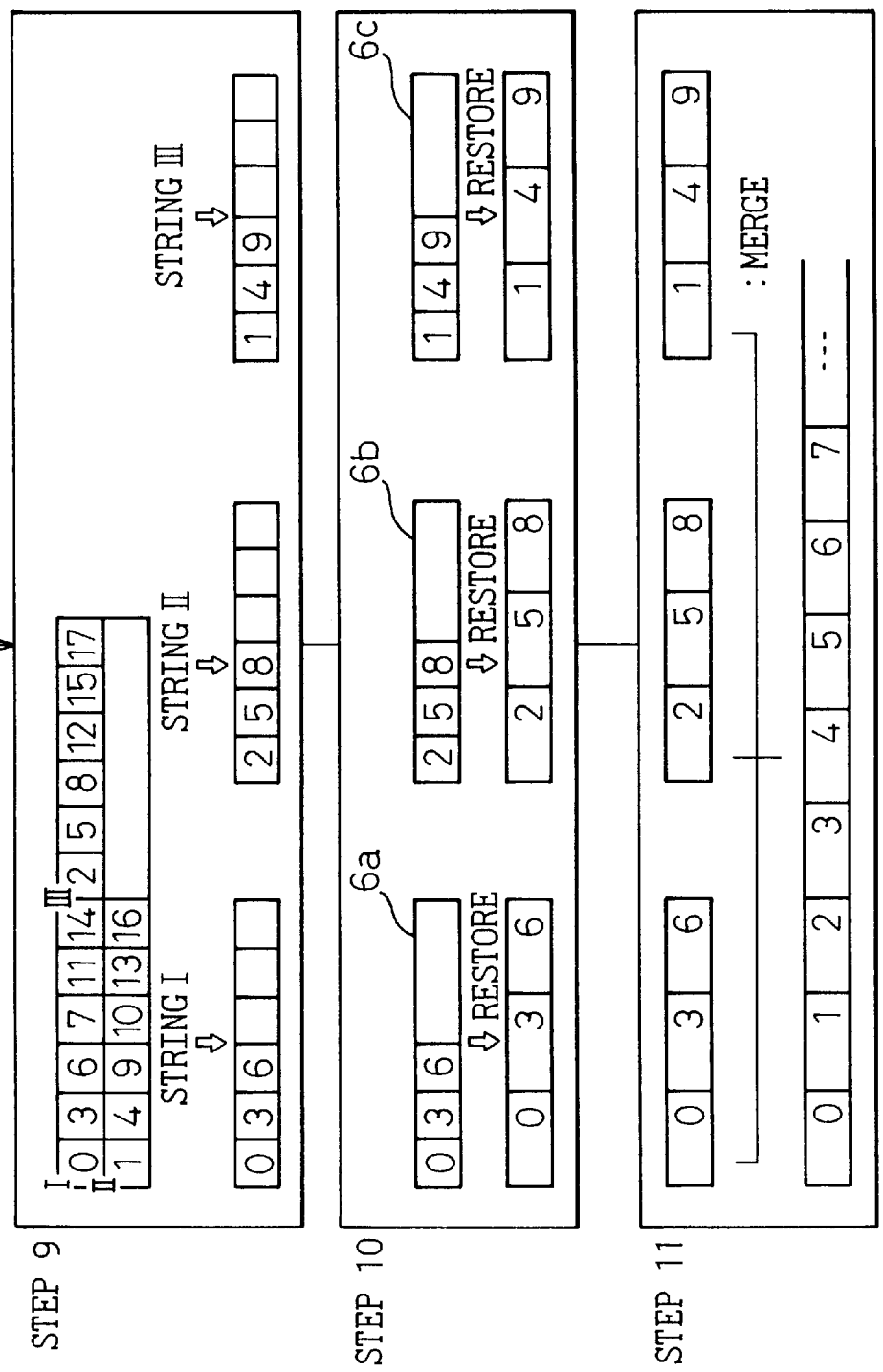

Fig.6A

| RECORD NUMBER | OFFSET 0 | | | | 5 | | | | | 10 | | | | | 15 | | | | | 20 | | | | | 25 | | | | | 30 |
|---|---|---|---|---|---|---|---|---|---|---|---|---|---|---|---|---|---|---|---|---|---|---|---|---|---|---|---|---|---|---|
| No.1 : | 0 | 0 | 0 | 1 | □ | H | I | Y | O | S | H | I | □ | □ | □ | 0 | 5 | 5 | 9 | - | 7 | 9 | - | 1 | 2 | 3 | 4 | □ | □ | S |
| No.2 : | 0 | 0 | 0 | 2 | □ | K | O | D | A | M | A | □ | □ | □ | □ | 0 | 5 | 5 | 9 | - | 7 | 9 | - | 7 | 8 | 9 | 4 | □ | □ | G |
| No.3 : | 0 | 0 | 0 | 3 | □ | T | A | K | A | H | A | S | H | I | □ | 0 | 5 | 5 | 8 | - | 9 | 9 | - | 8 | 2 | 3 | 0 | □ | □ | G |
| No.4 : | 0 | 0 | 0 | 4 | □ | O | B | A | T | A | □ | □ | □ | □ | □ | 0 | 5 | 5 | 8 | - | 5 | 9 | - | 9 | 4 | 5 | 4 | □ | □ | F |
| No.5 : | 0 | 0 | 0 | 5 | □ | Y | A | M | A | D | A | □ | □ | □ | □ | 0 | 5 | 5 | 8 | - | 5 | 9 | - | 8 | 5 | 2 | 4 | □ | □ | F |
| No.6 : | 0 | 0 | 0 | 6 | □ | M | A | E | J | I | M | A | □ | □ | □ | 0 | 5 | 5 | 7 | - | 8 | 8 | - | 1 | 9 | 6 | 3 | □ | □ | S |
| No.7 : | 0 | 0 | 0 | 7 | □ | M | U | R | A | K | A | M | I | □ | □ | 0 | 5 | 5 | 7 | - | 8 | 8 | - | 1 | 7 | 8 | 4 | □ | □ | G |
| No.8 : | 0 | 0 | 0 | 8 | □ | K | O | N | A | G | A | I | □ | □ | □ | 0 | 5 | 5 | 7 | - | 8 | 1 | - | 1 | 2 | 9 | 9 | □ | □ | S |
| No.9 : | 0 | 0 | 0 | 9 | □ | M | I | Z | U | N | O | □ | □ | □ | □ | 0 | 5 | 5 | 6 | - | 2 | 3 | - | 3 | 2 | 1 | 4 | □ | □ | G |

Fig.6B

| RECORD NUMBER | OFFSET 0 | | | | 5 | | | | | 10 | | | | | 15 | | | | | 20 | | | | | 25 | | | | | 30 |
|---|---|---|---|---|---|---|---|---|---|---|---|---|---|---|---|---|---|---|---|---|---|---|---|---|---|---|---|---|---|---|
| No.1 : | 0 | 0 | 0 | 1 | □ | H | I | Y | O | S | H | I | □ | □ | □ | 0 | 5 | 5 | 9 | - | 7 | 9 | - | 1 | 2 | 3 | 4 | □ | □ | S |
| No.2 : | * | * | * | 2 | □ | * | □ | □ | □ | □ | □ | □ | □ | □ | □ | * | * | * | * | * | * | * | * | * | * | * | * | □ | * | G |
| No.3 : | 0 | 0 | 0 | 3 | □ | T | A | K | A | H | A | S | H | I | □ | 0 | 5 | 5 | 8 | - | 9 | 9 | - | 8 | 2 | 3 | 0 | □ | □ | G |
| No.4 : | 0 | 0 | 0 | 4 | □ | O | B | A | T | A | □ | □ | □ | □ | □ | 0 | 5 | 5 | 8 | - | 5 | 9 | - | 9 | 4 | 5 | 4 | □ | □ | F |
| No.5 : | 0 | 0 | 0 | 5 | □ | Y | A | M | A | D | A | □ | □ | □ | □ | 0 | 5 | 5 | 8 | - | 5 | 9 | - | 8 | 5 | 2 | 4 | □ | □ | F |
| No.6 : | 0 | 0 | 0 | 6 | □ | M | A | E | J | I | M | A | □ | □ | □ | 0 | 5 | 5 | 7 | - | 8 | 8 | - | 1 | 9 | 6 | 3 | □ | □ | S |
| No.7 : | 0 | 0 | 0 | 7 | □ | M | U | R | A | K | A | M | I | □ | □ | 0 | 5 | 5 | 7 | - | 8 | 8 | - | 1 | 7 | 8 | 4 | □ | □ | G |
| No.8 : | 0 | 0 | 0 | 8 | □ | K | O | N | A | G | A | I | □ | □ | □ | 0 | 5 | 5 | 7 | - | 8 | 1 | - | 1 | 2 | 9 | 9 | □ | □ | S |
| No.9 : | 0 | 0 | 0 | 9 | □ | M | I | Z | U | N | O | □ | □ | □ | □ | 0 | 5 | 5 | 6 | - | 2 | 3 | - | 3 | 2 | 1 | 4 | □ | □ | G |

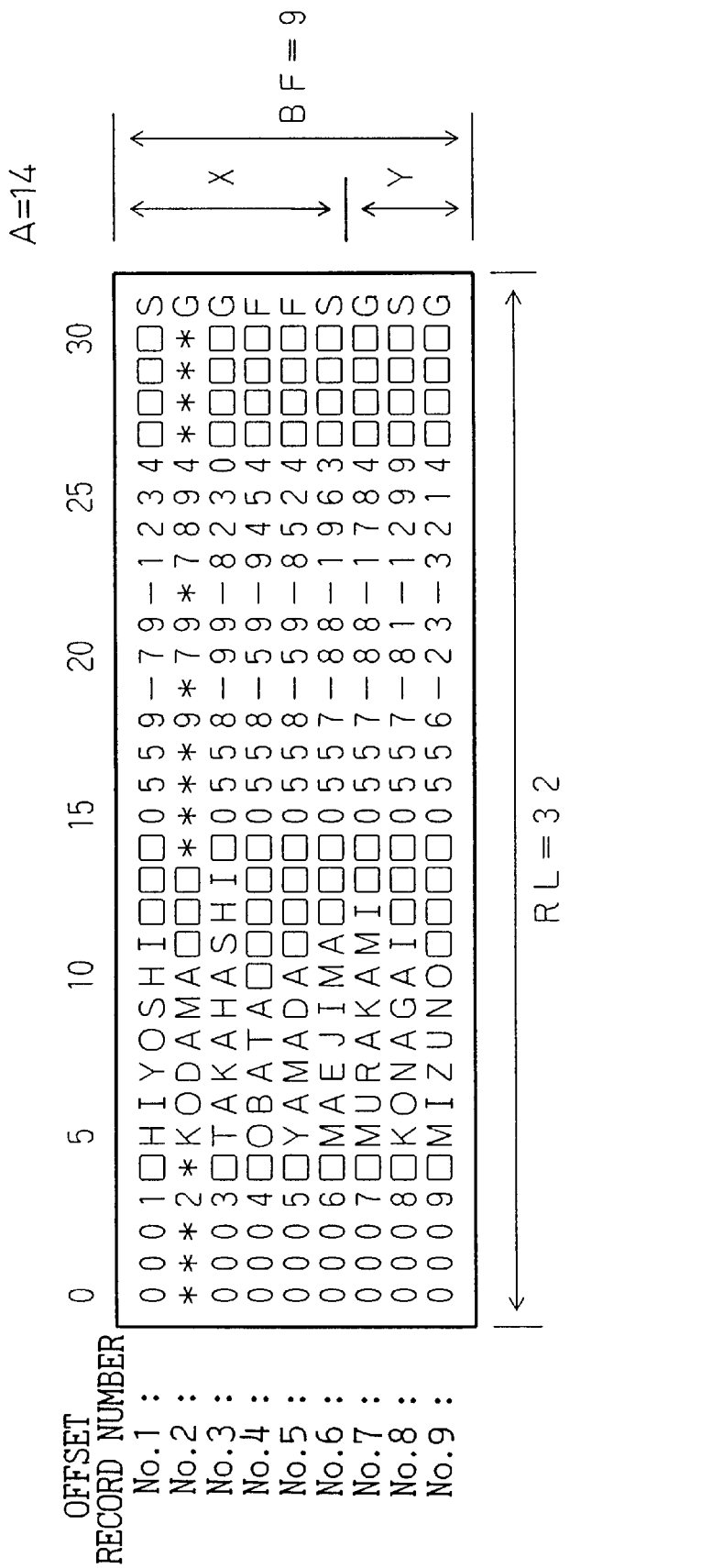

Fig.8A

| OFFSET | 0 | 5 | 10 | 15 | 20 | 25 | 30 | |
|---|---|---|---|---|---|---|---|---|
| RECORD NUMBER | | | | | | | | |
| No.1: | 0001 | HIYOSHI | | 0559 | -79- | 1234 | □□S | ⎫ FIRST |
| No.2: | □*□2 | *KODAMA | | □*** | -79* | 7894 | □□*□ | ⎪ RECORD |
| No.3: | 0003 | TAKAHASHI | | 0558 | -99- | 8230 | □□G | ⎬ GROUP |
| No.4: | 0004 | OBATA | | 0558 | -59- | 9454 | □□□□ | ⎪ |
| No.5: | 0005 | YAMADA | | 0558 | -59- | 8524 | □□□F | ⎪ |
| No.6: | 0006 | MAEJIMA | | 0557 | -88- | 1963 | □□□F | ⎭ |
| No.7: | 0007 | MURAKAMI | | 0557 | -88- | 1784 | □□S | ⎫ SECOND |
| No.8: | 0008 | KONAGAI | | 0557 | -81- | 1299 | □□S | ⎬ RECORD |
| No.9: | 0009 | MIZUNO | | 0556 | -23- | 3214 | □□G | ⎭ GROUP |

←———— RECORD LENGTH ————→   *: FLAG

Fig.8B

| OFFSET | 0 | 5 | 10 | 15 | 20 | 25 | 30 | |
|---|---|---|---|---|---|---|---|---|
| RECORD NUMBER | | | | | | | | |
| No.1: | 0001 | HIYOSHI | | 0559 | -79- | 1234 | □□S | ⎫ FIRST |
| No.2: | □*□2 | *KODAMA | | □*** | -79* | 7894 | □□*□ | ⎪ RECORD |
| No.3: | 0003 | TAKAHASHI | | 0558 | -99- | 8230 | □□G | ⎬ GROUP |
| No.4: | 0004 | OBATA | | 0558 | -59- | 9454 | □□□□ | ⎪ |
| No.5: | 0005 | YAMADA | | 0558 | -59- | 8524 | □□□F | ⎪ |
| No.6: | 0006 | MAEJIMA | | 0557 | -88- | 1963 | □□□F | ⎭ |
| No.7: | 0007 | MURAKAMI | | 0557 | -88- | 1784 | □□G | ⎫ SECOND |
| No.8: | 0008 | KONAGAI | | 0557 | -81- | 1299 | □□S | ⎬ RECORD |
| No.9: | 0009 | MIZUNO | | 0556 | -23- | 3214 | □□G | ⎭ GROUP |

←———— RECORD LENGTH ————→   *: FLAG

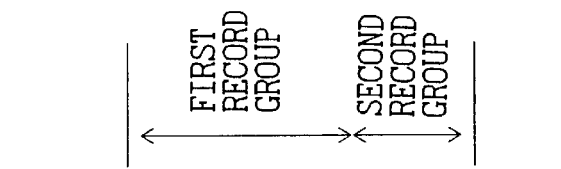

Fig.12A

| OFFSET RECORD NUMBER | 0 | 5 | 10 | 15 | 20 | 25 | 30 | |
|---|---|---|---|---|---|---|---|---|
| No.1 : | 0 0 0 1 □ H I Y O S H I □ □ □ □ 0 5 5 9 − 7 9 − 1 2 3 4 □ □ □ □ S | | | | | | | ⎫ FIRST RECORD GROUP |
| No.2 : | * * * 2 * K O D A M A □ □ □ □ * * * * * 9 − * 7 9 − 7 8 9 4 * * * G | | | | | | | |
| No.3 : | 3 □ T A K A H A S H I □ □ □ □ □ 8 9 9 − 8 2 3 0 □ □ □ □ F | | | | | | | |
| No.4 : | 4 □ O B A T A □ □ □ □ □ □ □ 8 9 5 − 9 4 5 4 □ □ □ □ F | | | | | | | |
| No.5 : | 5 □ Y A M A D A □ □ □ □ □ □ 8 9 8 − 8 5 2 4 □ □ □ □ S | | | | | | | |
| No.6 : | 6 □ M A E J I M A □ □ □ □ 7 9 8 − 1 9 6 3 □ □ □ □ G | | | | | | | ⎫ SECOND RECORD GROUP |
| No.7 : | 7 □ M U R A K A M I □ □ □ 7 8 8 − 1 7 8 4 □ □ □ □ S | | | | | | | |
| No.8 : | 8 □ K O N A G A I □ □ □ □ 7 8 1 − 1 2 9 9 □ □ □ □ S | | | | | | | |
| No.9 : | 9 □ M I Z U N O □ □ □ □ □ 6 2 3 − 3 2 1 4 □ □ □ □ G | | | | | | | |

←―――――― RECORD LENGTH ――――――→    * : FLAG

Fig.12B

| OFFSET RECORD NUMBER | 0 | 5 | 10 | 15 | 20 | 25 | 30 | |
|---|---|---|---|---|---|---|---|---|
| No.1 : | 0 0 0 1 □ H I Y O S H I □ □ □ □ 0 5 5 9 − 7 9 − 1 2 3 4 □ □ □ □ S | | | | | | | ⎫ FIRST RECORD GROUP |
| No.2 : | 0 0 0 2 □ K O D A M A □ □ □ □ 0 5 5 9 − 7 9 − 7 8 9 4 □ □ □ □ G | | | | | | | |
| No.3 : | 0 0 0 3 □ T A K A H A S H I □ □ □ 0 5 5 8 − 9 9 − 8 2 3 0 □ □ □ □ G | | | | | | | |
| No.4 : | 0 0 0 4 □ O B A T A □ □ □ □ □ 0 5 5 8 − 9 9 − 9 4 5 4 □ □ □ □ F | | | | | | | |
| No.5 : | 0 0 0 5 □ Y A M A D A □ □ □ □ 0 5 5 8 − 9 9 − 8 5 2 4 □ □ □ □ F | | | | | | | |
| No.6 : | 0 0 0 6 □ M A E J I M A □ □ □ 0 5 5 7 − 8 8 − 1 9 6 3 □ □ □ □ S | | | | | | | ⎫ SECOND RECORD GROUP |
| No.7 : | 0 0 0 7 □ M U R A K A M I □ □ 0 5 5 7 − 8 8 − 1 7 8 4 □ □ □ □ G | | | | | | | |
| No.8 : | 0 0 0 8 ▽ K O N A G A I □ □ □ 0 5 5 7 − 8 1 − 1 2 9 9 □ □ □ ▽ S | | | | | | | |
| No.9 : | 0 0 0 9 ▽ M I Z U N O □ □ □ □ 0 5 5 6 − 2 3 − 3 2 1 4 ▽ ▽ ▽ ▽ G | | | | | | | |

←―――――― RECORD LENGTH ――――――→    * : FLAG

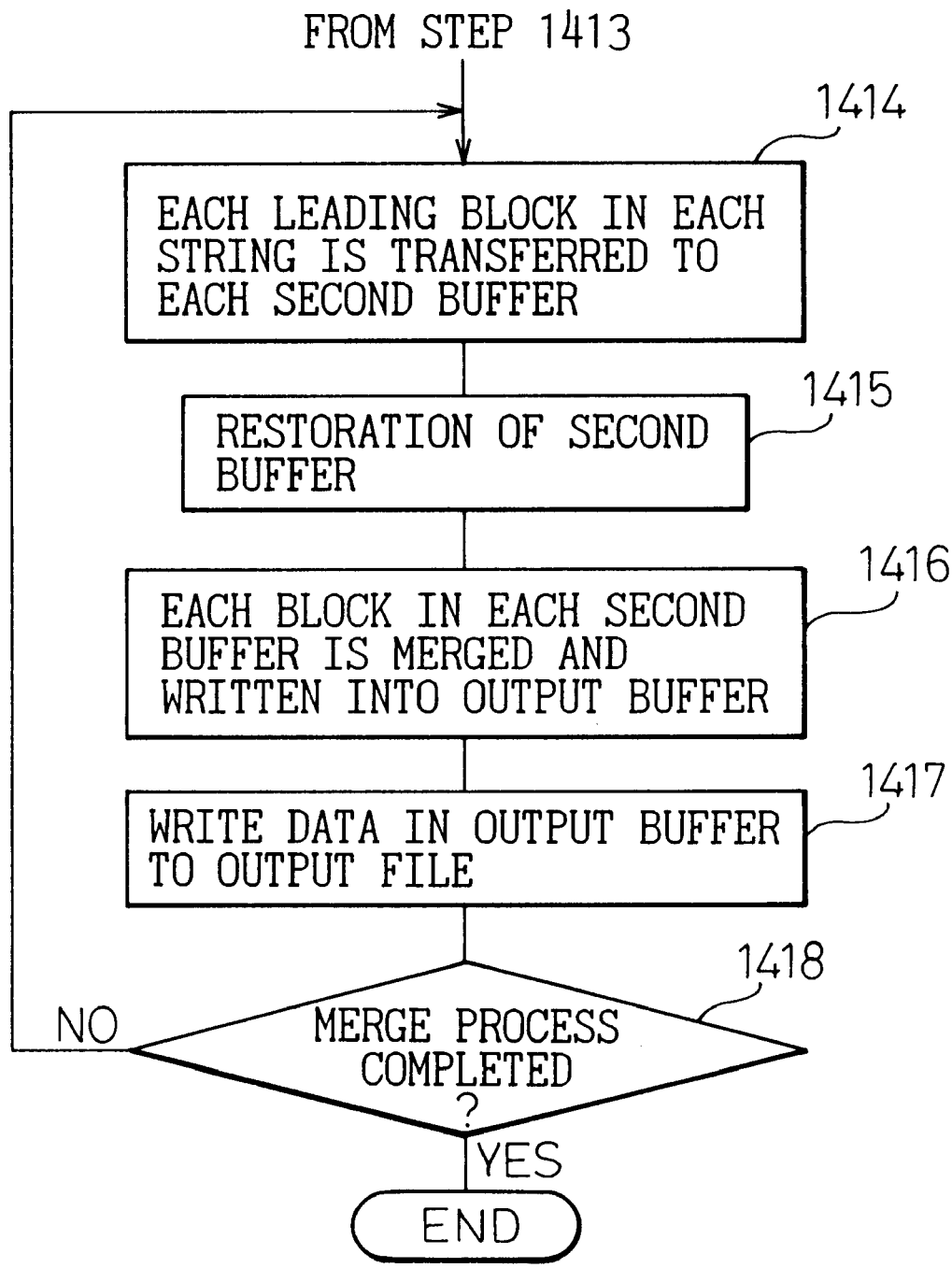

METHOD FOR DATA COMPRESSION AND RESTORATION

BACKGROUND OF THE INVENTION

1. Field of the Invention

The present invention relates to a method for data compression and restoration, an apparatus and a method for sort-merging, and storage media therefor.

2. Description of the Related Art

As a method for compressing data consisting of numeric characters, alphabetic characters, chinese characters and the like, a dictionary type coding system is known. The dictionary type coding system comprises a dictionary that collects coded data corresponding to different character strings each created in a predetermined form. The system uses the dictionary to compress data having the character strings by the registered codes corresponding to the strings stored in the dictionary. The system further compresses data having the same character in series with the use of control characters. This system is required to register character strings each having a predetermined form and to store the strings with corresponding codes in advance. Namely, time and labour are required for making the dictionary. In addition, any character strings that are not registered cannot be compressed. Furthermore, the system requires time for data compression when sequentially retrieving each of the registered characters.

Therefore, a method of data record compression, as disclosed in the Japanese patent publication No. 7-239771, was proposed that dispenses with creation of the dictionary. According to this method, data records in a file, each record having a plurality of fields, can be compressed when fields having the same value exist in the consecutive data records in the data file.

The above method of data record compression vertically compresses a part in which a predetermined number of the same characters consecutively appear in the same field location in the two consecutive data records, and horizontally compresses a part in which a predetermined number of the same characters consecutively appear in the vertically compressed records.

By the way, in general, a sort-merge process is executed when sorting a large amount of data records. The sort-merge process has the steps of, reading a plurality of data records stored in an input file in a storage unit one by one into an input buffer in a memory, transferring the data records stored in the input buffer to a working area in the memory until the working area becomes full, transferring a group of data records transferred to the working area to a temporary buffer after sorting the group of the data records, and transferring the group of data records from the temporary buffer to a temporary file in the storage unit. The sort-merge process repeats the above series of steps for all of the data records to be sorted, then executes the steps of transferring the group of data records having been sorted and stored in the temporary file to each individual temporary buffer in the memory, transferring the data stored in the temporary buffer to a work area in the memory, generating a string of records by merging, and outputs the string of records to an output file.

However, the method of data record compression disclosed in the Japanese patent publication No. 7-239771 can compress two consecutive data records but cannot compress more than that at one time. Therefore the method is inefficient.

On the other hand, the sort-merge process according to the prior art requires a long time for data transmission between the temporary file in the external storage unit and the temporary buffer in the main memory when a large volume of data records are sorted, and the size of data to be stored in the external storage is increased. Thus, the sort-merge processing time is increased and the disc space in the external storage unit cannot be ensured.

SUMMARY OF THE INVENTION

Therefore, it is a first object of the present invention to provide a method for data compression and restoration that improves compression efficiency by compressing a plurality of data records at one time. It is a second object of the present invention to provide an apparatus and a method for sort-merging that decreases processing time due to compression of data to be transferred, thereby ensuring the disc space in the external storage device.

FIG. 1 is an explanatory drawing of a method for data compression according to the present invention.

In order to accomplish the first object, it is considered that a file may include records, in which each record consists of a plurality of columns and is created in a predetermined format as a unit, such as a spread sheet. In general, such a files has a high probability to have the same data in the same column location throughout the records. Thus, it is considered that these column locations can be used for the purpose of data compression.

According to a first aspect of the present invention that achieves the first object, there is provided a method for compressing a file having a plurality of (n) records each consisting of a plurality of (m) columns and created in a predetermined format, comprising the steps of: searching for one or more column locations 2, 5, . . . in which the data is the same throughout the records; calculating the number of records which can be compressed in the file based on the number of the found column locations; determining a first record group 1, 2, . . . , K consisting of records to be compressed and a second record group (K+1), . . . , n consisting of one or more records to be excluded based on the calculated number of records which can be compressed; determining a first record 1 from the first record group, the first record data being kept the same; memorizing the addresses of the found column locations in a second record 2 selected from the first record group, the second record 2 being different from the first record 1; and transferring data stored in other column locations 1, 3, 4, 6, . . . , m in the one or more records (K+1), . . . , n in the second record group to the column locations 2, 5, . . . in records 3, 4, . . . , K in the first record group except the first 1 and the second 2 records.

According to the first aspect of the present invention, another method is provided for compressing a file having a plurality of records each consisting of a plurality of fields each having at least a column and created in a predetermined format. This other method searches for field locations in which the data is the same throughout the records instead of the column locations.

According to a second aspect of the present invention that achieves the first object, there is provided a method for restoring a compressed file to an original file. The original file has a plurality of (n) records each consisting of a plurality of (m) columns, is created in a predetermined format, and is divided into a first record group 1, 2, . . . , K corresponding to the compressed file and a second record group (K+1), . . . , n, to be excluded from the original file.

Column locations in which the data is the same are searched for throughout the records in the original file, and the compressed file stores data in the column locations 2, 5, . . . in records except a first 1 and a second 2 records. The data in the first record is kept the same, the second record being different from the first record and having been used for memorizing the addresses of the found column locations before the restoration. The data have been originally stored in the other column locations 1, 3, 4, 6, . . . , m in one or more records (K+1), . . . , n in the second record group of the original file. This method comprises the steps of: transferring data stored in the column locations 2, 5, . . . in the records 3, 4, . . . , K except the first and the second records in the compressed file to other column locations 1, 3, 4, 6, . . . , m in the one or more records (K+1), . . . , n in the second record group of the original file; and copying data stored in the column locations 2, 5, . . . in the first record 1 in the first record group, in the addresses of the column locations 2, 5, . . . in the one or more records (K+1), . . . , n in the second record group and the second record 2 in the first record group.

According to the second aspect of the present invention, another method is provided for restoring a compressed file to an original file. The original file has a plurality of records each consisting of a plurality of fields each having at least a column and is created in a predetermined format and. The original file is being divided into a first record group corresponding to the compressed file and a second record group to be excluded from the original file. Field locations in which the data is the same are searched for throughout the records in the original file, and the compressed file stores data in the found field locations in records except a first 1 and a second 2 records. The data in the first record 1 kept the same, the second record 2 being different from the first record and having been used for memorizing the addresses of the found field locations before the restoration. The data have been originally stored in the other field locations in one or more records in the second record group of the original file. This other method searches for field locations in which the data is the same throughout the records instead of the column locations.

According to a third aspect of the present invention that achieves the second object, there is provided an apparatus for sort-merging a plurality of records in an input file stored in a storage device, comprising: an input means for inputting the records from the storage device to a memory one by one; a sorting means for sorting a determined number of input records as a unit in accordance with a determined key; a first buffer for storing the sorted record group; a compression means for compressing the record group stored in the first buffer; a first data transferring means for transferring the compressed record group from the first buffer to a temporary file in the storage; a second data transferring means for transferring the record group from the temporary file to the memory; a restoration means for restoring the transferred record group; a plurality of buffers in the memory for storing the restored records, the buffers being different from the first buffer; a merging means for merging the plurality of restored record groups and generating a string of records; and an output means for outputting the string of records to an output file in the storage device.

According to a fourth aspect of the present invention that achieves the second object, there is provided a method for sort-merging a plurality of records in an input file stored in a storage device, comprising: a first step for inputting the records from the storage device to a memory one by one; a second step for sorting a determined number of input records as a unit in accordance with a determined key; a third step for storing the sorted record group in a first buffer; a fourth step for compressing the record group stored in the first buffer; a fifth step for transferring the compressed record group from the first buffer to a temporary file in the storage; a sixth step for transferring the record group from the temporary file to the memory; a seventh step for restoring the transferred record group; a eighth step for storing the restored records in a plurality of buffers in the memory, the buffers being different from the first buffer; a ninth step for merging the plurality of restored record groups and generating a string of records; and a tenth step for outputting the string of records to an output file in the storage.

According to a fifth aspect of the present invention, there is provided a storage medium for storing a program to make a computer execute the steps described in each method according to the above first, second or fourth aspect of the present invention.

BRIEF DESCRIPTION OF THE DRAWINGS

The present invention will be more clearly understood from the description as set forth below with reference to the accompanying drawings, wherein:

FIG. 5 is a third part of a flowchart of a sort-merge process of an embodiment according to the present invention;

FIG. 6A is a diagram showing a buffer having nine records before compression to explain a primary process of a method for data compression according to the present invention;

FIG. 6B is a diagram showing the contents of the buffer shown in FIG. 6A after column numbers are searched in which data in the column is equal throughout all records in the buffer;

FIG. 7 is an explanatory diagram for a calculation routine for calculating the number of records which can be compressed in a method of data compression of an embodiment according to the present invention;

FIG. 8A is a diagram showing records to be excluded to explain a character data transferring process of a method for data compression according to the present invention;

FIG. 8B is a diagram showing data to be transferred in the records to be excluded shown in FIG. 8A;

FIG. 9A is a diagram showing a storage area in the records to be compressed to explain a character data transferring process of a method for data compression according to the present invention;

FIG. 9B is a diagram showing a data array in a buffer after executing the compression;

FIG. 12A shows a buffer in a state that characters compressed in other offset locations corresponding the offset locations without the flags * in the second record have been restored in the previous offset locations in the previous records;

FIG. 12B shows a buffer in a state that all characters have been restored;

FIG. 15 is a flowchart of a merging process of a sort-merge process according to the present invention.

DESCRIPTION OF THE PREFERRED EMBODIMENTS

The preferred embodiments of the present invention will be described below with reference to the accompanying drawings.

Figure 1:
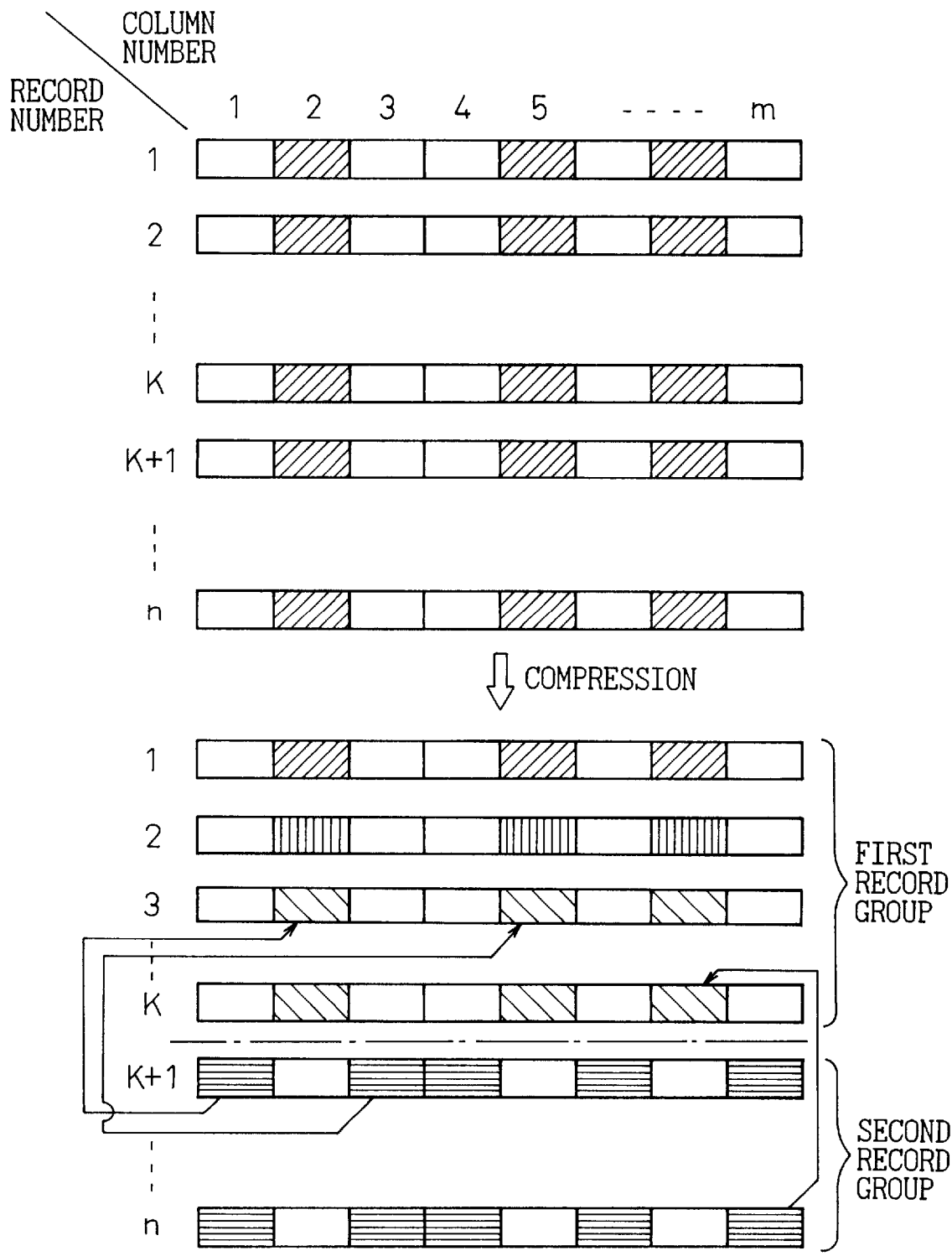
FIG. 1 is an explanatory drawing of a method for data compression according to the present invention.
Figure 2:
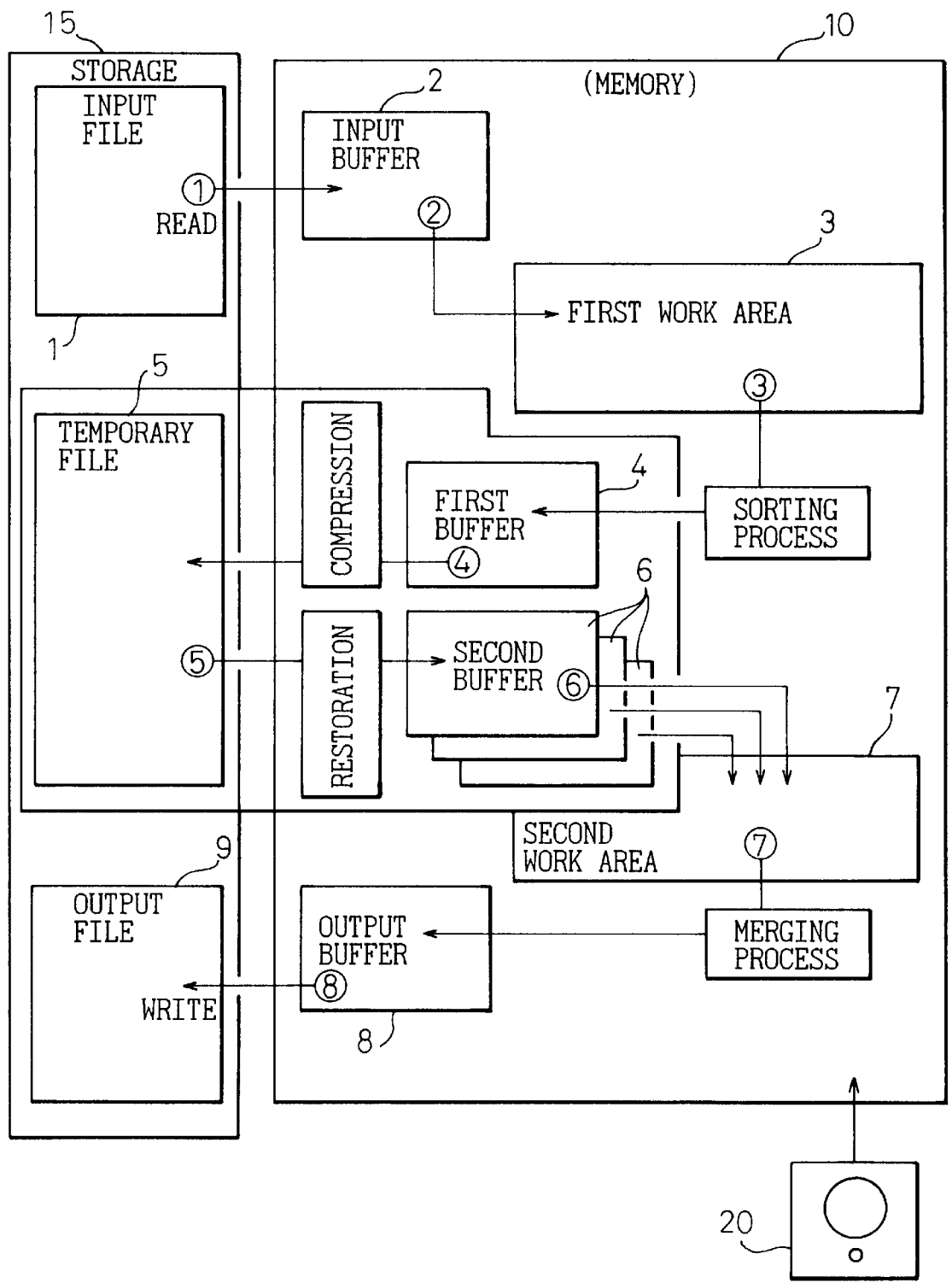
FIG. 2 is a schematic diagram of an apparatus for a sort-merge process according to the present invention.

FIG. 2 is a schematic diagram of an apparatus for a sort-merging process according to the present invention. The apparatus 10 according to the third aspect of the invention receives a plurality of records one by one from an input file 1, and temporarily stores the records in an input buffer 2 and executes a sort-merge process in a first working area 3. The apparatus 10 comprises a sorting means that sorts every predetermined number of records in accordance with a predetermined key. A first buffer 4 temporarily stores each group of records being sorted. A compression means compressed the group of records stored in the first buffer 4, and a transfer means transfers the compressed record group from the first buffer to a temporary file 5. A plurality of second buffers 6 each individually receive a plurality of record groups transferred from the temporary file 5. A restoring means restores the group of records temporarily stored in the second buffer 6 in a second working area 7. A first row generating means for generates a row of records after merging the plurality of restored record groups in the second working area 7. A first output means outputs the generated row of records by the merging via an output buffer 8 to an output file 9. The input file 1, the temporary file 5 and the output file 9 are stored in a storage device 15 such as a disc unit.

All of the above means can be carried out by executing each respective program stored in a memory in the apparatus 10. An auxiliary storage (not shown) is connected to the apparatus 10. The CPU of the apparatus 10 reads various programs recorded in a storage media 20 via the auxiliary storage, stores the programs into a memory and carries out various processes by executing the programs.

According to the apparatus for a sort-merge process shown in FIG. 2, input/output processing time can be decreased and disc space can be saved because the length of data to be transferred between the temporary file, the first buffer and the second buffer is short due to the data compression.

Figure 3:
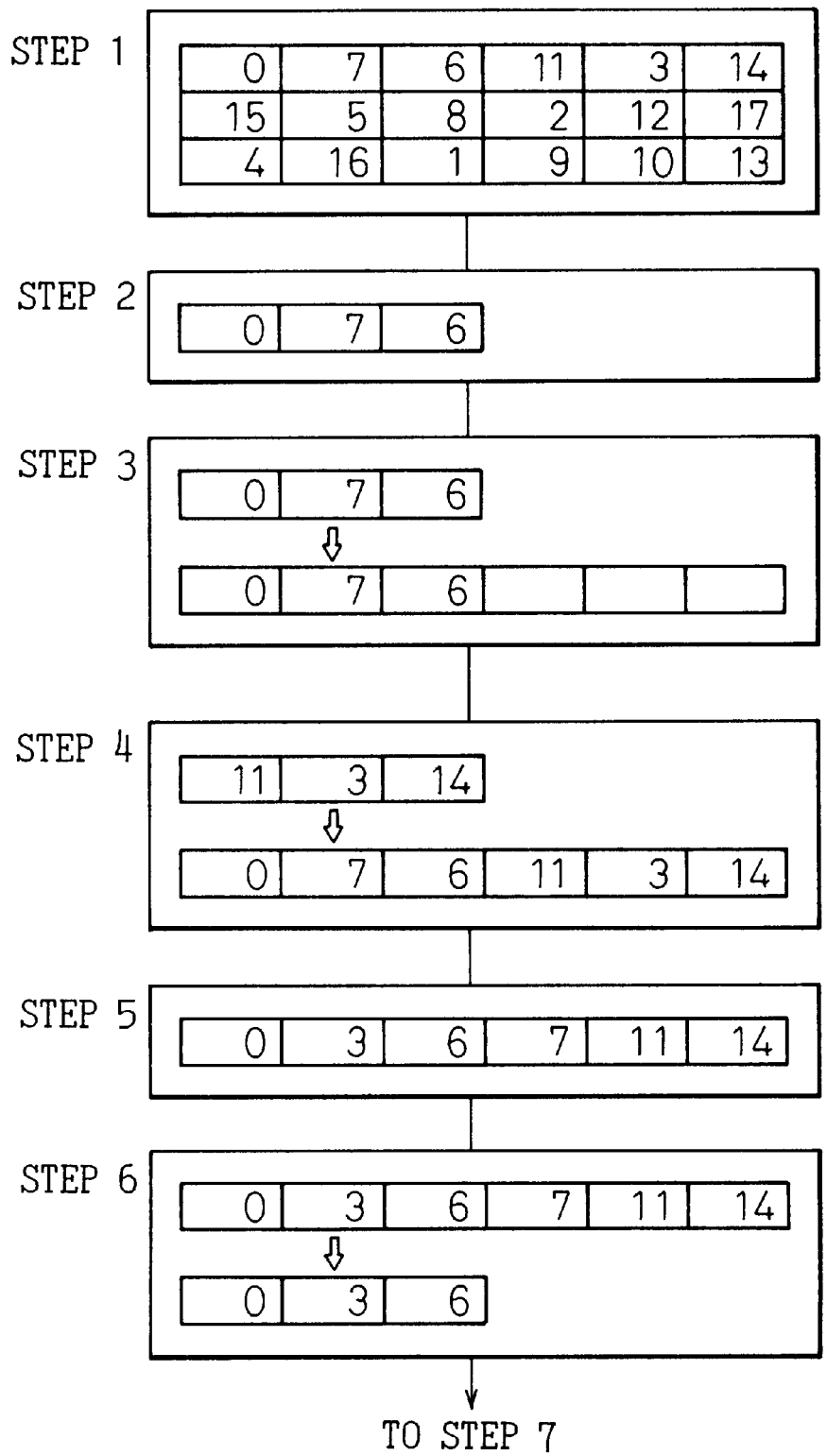
FIG. 3 is a first part of a flowchart of a sort-merge process of an embodiment according to the present invention.
Figure 4:
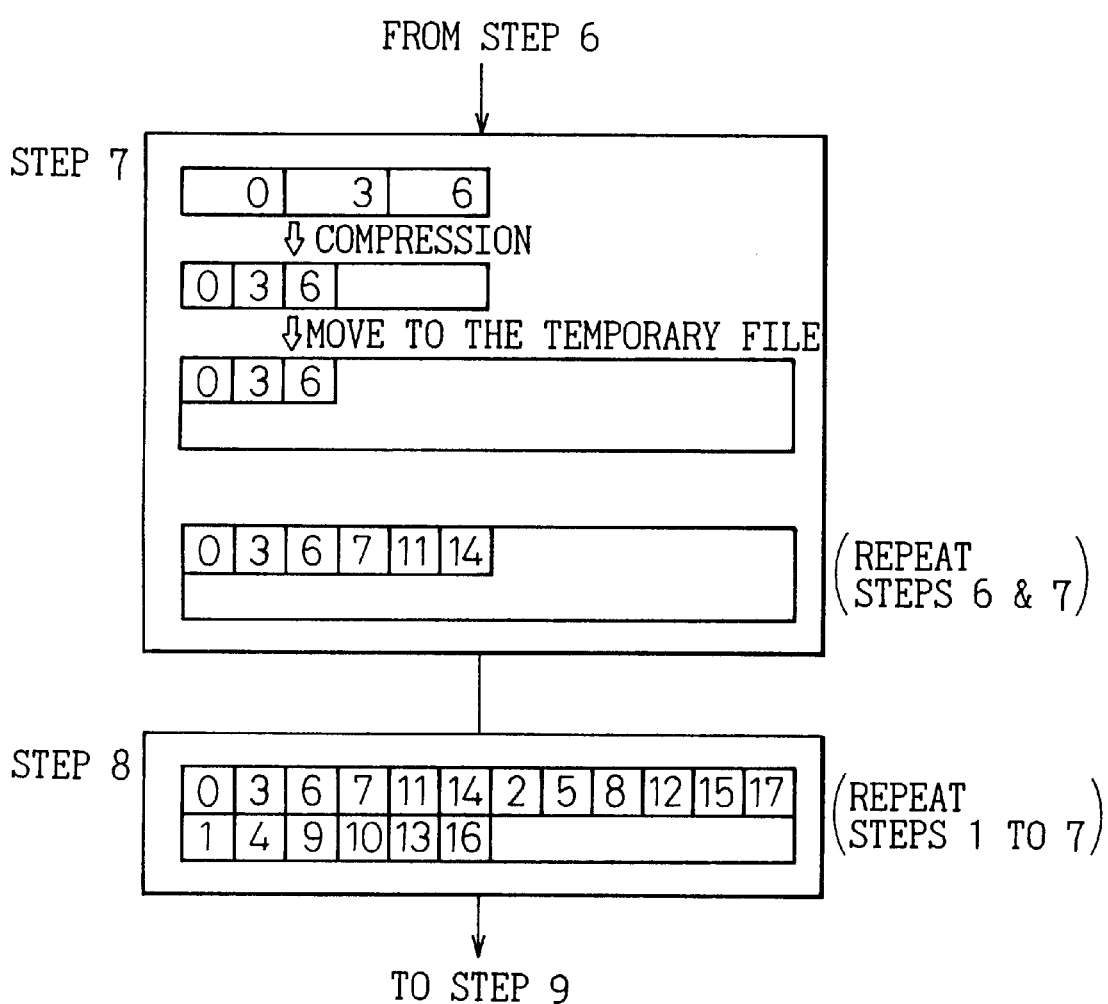
FIG. 4 is a second part of a flowchart of a sort-merge process of an embodiment according to the present invention.

FIGS. 3 to 5 show a flowchart of a sort-merge process of an embodiment according to the present invention. The embodiment of the invention shows an example to sort-merge eighteen records with the use of the apparatus shown in FIG. 2. Referring to FIG. 2 and FIGS. 3 to 5, a sort-merge process according to the present invention will be explained below.

First, in step 1, eighteen records to be sort-merged are entered in the input file 1.

In step 2, three records having numbers 0, 7 and 6 are read into the input buffer 2 in the main memory (hereinafter referred to as "memory") from the input file 1. In step 3, the records, numbers 0, 7 and 6, in the input buffer 2 are transferred to the first working area 3 in the memory one by one. In step 4, records having numbers 11, 3 and 14 are read into the input buffer 2 in the memory from the input file 1, and transferred to the first working area 3 in the memory since there are empty areas in the first working area 3. As a result, records having numbers 0, 7, 6, 11, 3 and 14 are written in the working area 3.

In step 5, the records 0, 7, 6, 11, 3 and 14 are sorted in ascending order if the working area 3 is full. As a result of the sorting, records in the order 0, 3, 6, 7, 11 and 14 are obtained. In step 6, three sorted records, 0, 3 and 6, are transferred to the first buffer 4 for temporary use since data remain in the input file 1 because only three records can be stored in the first buffer 4.

Next, in step 7 shown in FIG. 4, three records, 0, 3 and 6, are transferred to the temporary file 5 after compressing the records in the first buffer 4. Steps 6 and 7 are repeated, then records in the temporary file 5 become 0, 3, 6, 7, 11 and 14 in order. Next, in step 8, steps 2 to 7 are repeated after reading the rest of records entered into the input file 1 in step 1. As a result, records in the order 0, 3, 6, 7, 11 and 14; 2, 5, 8, 12, 15 and 17; and 1, 4, 9, 10, 13 and 16, are obtained in the temporary file 5 as shown in FIG. 4.

In step 9 shown in FIG. 5, each leading block having three records in each string I, II and III stored in the temporary buffer 5 is respectively read into three second buffers 6a, 6b and 6c in the memory. That is, a record group having records 0, 3 and 6 is read into second buffer 6a from the string I, a record group having records 2, 5 and 8 is read into second buffer 6b from the string II, and a record group having records 1, 4 and 9 is read into second buffer 6c from the string III. Next, in step 10, each record group having three records is read into the second buffers 6a, 6b and 6c that temporarily store data, and is respectively restored. In step 11, the restored record groups are transferred to the second working area 7 in the memory, merged in the second working area 7 and the merge result is written into the output file 9 via the output buffer 8 as shown in FIG. 5.

Hereinafter, an embodiment of a method for data compression according to the first aspect of the present invention will be explained.

First, a primary process of the method for data compression will be explained referring to FIGS. 6A and 6B.

FIG. 6A is a diagram showing a buffer having nine records before compression, and FIG. 6B is a diagram showing the contents of the buffer shown in FIG. 6A after column numbers are searched in which data in the column is equal throughout all records in the buffer. From FIG. 6A, each record from a first record to a ninth record consists of thirty two characters, so that the record length consists of thirty two bytes because a character is a byte. Thus, a buffer length shown in both FIG. 6A and FIG. 6B consists of two hundred and eighty eight bytes. As shown in FIGS. 6A and 6B, each record is divided into thirty two columns each indicated with offset number from 0 to 31.

The primary process of the method for data compression is carried out by the following procedure.

(Step 1) Characters at the same offset numbers from 0 to 31 in the first record and the second record are compared. Here offset numbers indicate how far the columns are away from the leading column. For example, in the first record, at offset number 3 is character "1", at offset number 5 is character "H" and at offset number 20 is character "7". In this way, each record has a character data in each offset number location, from 0 to 31.

(Step 2) The same character data is found in each offset location in both first and second records in step S1, a flag "*" is marked at the corresponding offset location in the second record. This flag "*" is properly determined by selecting from character data that is not used in the second record.

(Step 3) Next, characters at the same offset numbers from 0 to 31 in the first record and the third record are compared and, if the character data are the same, characters in the same offset numbers from 0 to 31 in the first record and the fourth to the ninth records are repeatedly compared.

(Step 4) If a different character is detected during the comparison, the flag "*" in the second record is transferred to the same column location in the first record and the comparison is stopped.

(Step 5) Furthermore, characters at the same offset numbers from 0 to 31 in the first record and the second record are repeatedly compared up to the same offset number 31, namely, up to the record length.

FIG. 6B indicates the contents of the buffer after the above steps 1 to 5 are executed. As shown in FIG. 6B, it is understood that the character in the offset location marked with the flag * in the second record is the same throughout the records.

FIG. 7 is an explanatory diagram for a calculation routine for calculating the number of records which can be compressed in a method of data compression of an embodiment according to the present invention. As shown in FIG. 7, RL denotes the record length, BF (blocking factor) denotes the record number in a file, A denotes the number of the flags *, X denotes the number of records after compression and Y denotes the number of records to be excluded. The following equation is obtained.

$$Y = BF - X \quad (1)$$

wherein RL=32 (bytes), BF=9 (records) and A=14.

The relationship between the byte number of data to be compressed and the byte number of data to be excluded is expressed as below because the byte number of data to be compressed is equal to or less than the byte number of data to be excluded.

$$Y(RL-A) \leq (X-2)A \quad (2)$$

The reason for subtracting 2 from X is that the first record must be reserved for storing the character data in column locations corresponding to the flags * in the second record and the second record must be used for storing the addresses of the offset locations indicated with the flags * in the second record. Thus, two records must be excluded as records not to be compressed. According to the embodiment of the present invention, the following equation is obtained.

$$Y = 9 - X \quad (1')$$

$$Y(32-14) \leq (X-2)14 \quad (2')$$

The equation (2') can be substituted by the following equation, $$9Y \leq (X-2)7 \quad (2'')$$

Thus, $Y \leq 3.0625$, and the maximum integer in Y, that is 3, is the number of records which can be compressed.

Next, an embodiment of a method for data compression according to the present invention will be explained.

FIG. 8A is a diagram showing records to be excluded and FIG. 8B is a diagram showing data to be transferred in the records to be excluded shown in FIG. 8A. As explained above, the number of records which can be compressed is determined as 3. Therefore, three records excluding the first and second records, for example, the seventh to the ninth records are determined as records to be excluded as shown in FIG. 8A because the first record is used for storing the character data in column locations corresponding to the flags * in the second record and the second record is used for storing the addresses of the offset locations with the flags * in the second record. The character data in column locations corresponding to the flags * from the third record to the sixth record can be used for storing any data for the purpose of the compression. The present invention, therefore, uses these column locations in the third to the sixth records for storing character data stored in other column locations in the seventh to the ninth records which correspond to column locations without the flags * in the second record. As can be seen from FIG. 8B, column locations of which data are to be transferred in the seventh to the ninth records are offset numbers 3, 5 to 13, 18, 20, 21, 23 to 26 and 31.

Next, an embodiment of a character data transferring process of a method for data compression according to the present invention will be explained.

FIG. 9A is a diagram showing a storage area in the records to be compressed, and FIG. 9B is a diagram showing a data array in a buffer after executing the compression. As shown in FIG. 9A, the character data to be transferred in the records to be excluded shown in FIG. 8B are transferred to character locations in the third to sixth records corresponding to the character locations with flags * in the second record. That is, the above character locations in the third to sixth records are reserved for storing character data to be transferred from the seventh to ninth records. As can be seen in FIG. 9B, nine records can be compressed to six records according to the invention.

Figure 10:
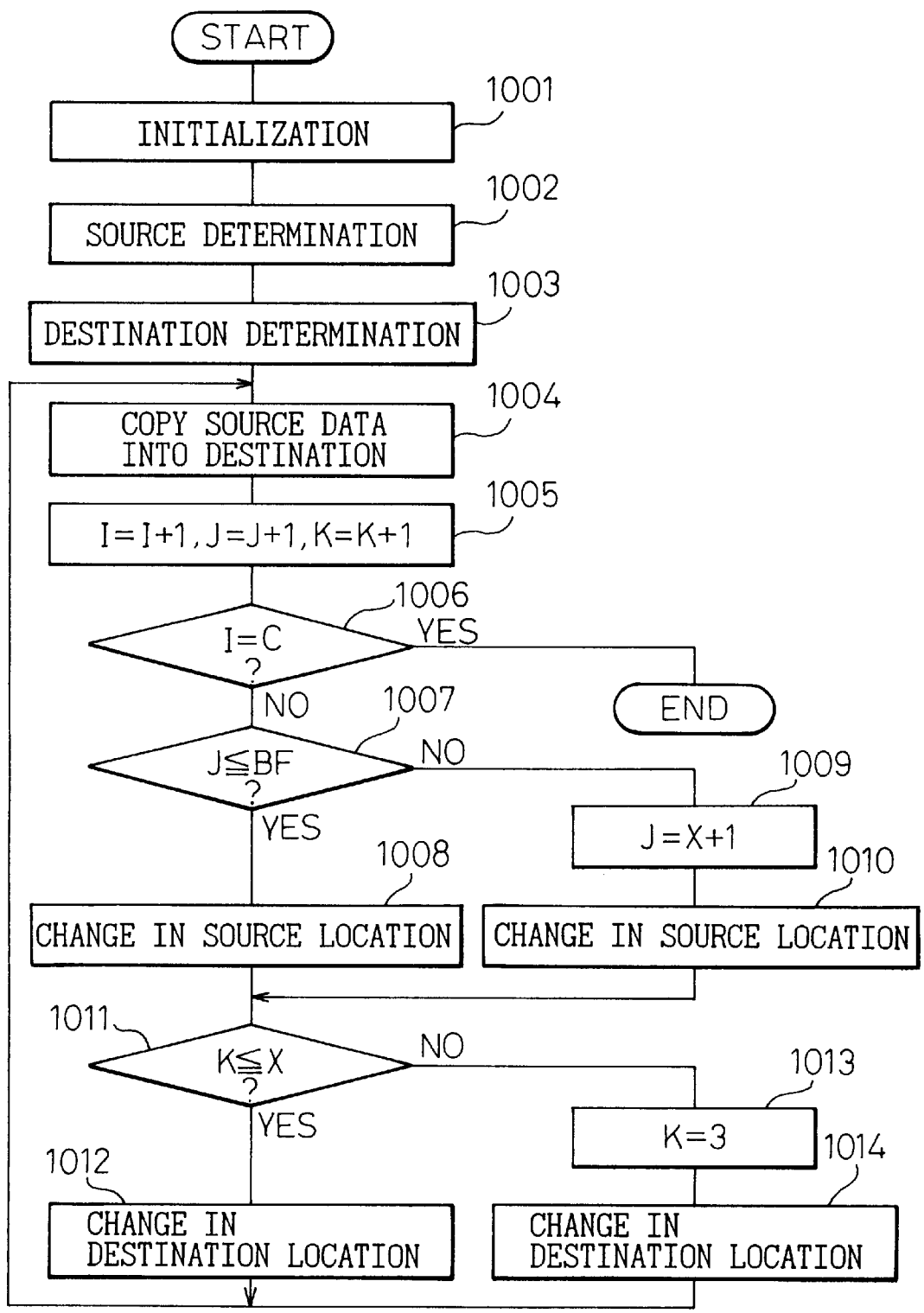
FIG. 10 is a flowchart of a method for data compression according to the present invention.

FIG. 10 is a flowchart of a method for data compression according to the present invention. The method for data compression will be explained referring to FIGS. 8A, 8B, 9A and 9B below.

First, in step 1001, initialization is executed, namely, the following are respectively set, I=0, BF=(X+Y)=9, X=6, C=(record length−number of flags)×(BF−X)=(32−14)×(9−6)=54, a counter of a source of record J=X+1=6+1=7, and a counter of a destination of record K=3, wherein I denotes a counter used for determining whether this processing routine has completed. The routine ends when the counter I counts up to the number C (=54) of characters to be transferred, BF denotes the record number before the compression, that is 9, X denotes the record number after the compression, that is 6, Y=(BF−X)=9−6=3 as shown in FIG. 7.

In step 1002, offset locations in source records J (7, 8, 9, 7, 8, 9, 7, . . . ) to be transferred are determined corresponding to offset locations without the flags * in the second record. In step 1003, offset locations in destination records K (3, 4, 5, 6, 3, 4, 5, 6, . . . ) to transfer are determined corresponding to offset locations with the flags * in the second record.

In step 1004, characters in offset locations in source records J are copied in the offset locations in destination records K.

In step 1005, 1 is respectively added to I, J and K.

In step 1006, whether or not the counter I has counted up to C is checked, if the result is affirmative, the process ends, if the result is negative, the process proceeds to step 1007.

In step 1007, whether $J \leq BF$ is checked, if $J \leq BF$, the process proceeds to step 1008, if J>BF, the process proceeds to step 1009.

In step 1008, the offset location to be transferred is changed to the same offset location in the source record J and the process proceeds to step 1011.

In step 1009, J=X+1 is calculated.

In step 1010, the offset location to be transferred is changed to the next offset location without the flags *, different from the previous offset location in the source record J and the process proceeds to step 1011.

In step 1011, whether K≦X is checked, if K≦X, the process proceeds to step 1012, if K>X, the process proceeds to step 1013.

In step 1012, the offset location to be transferred is changed to the offset location in the destination record K and the process returns to step 1004.

In step 1013, K is set to 3, then the process proceeds to step 1014.

In step 1014, the offset location to be transferred is changed to the offset location in the destination record K and the process returns to step 1004.

Steps 1004 to 1014 are repeated until I is counted up to C, namely, the process ends when I=54.

Next, an embodiment of a method for data restoration according to the second aspect of the present invention will be explained.

Figure 11A:
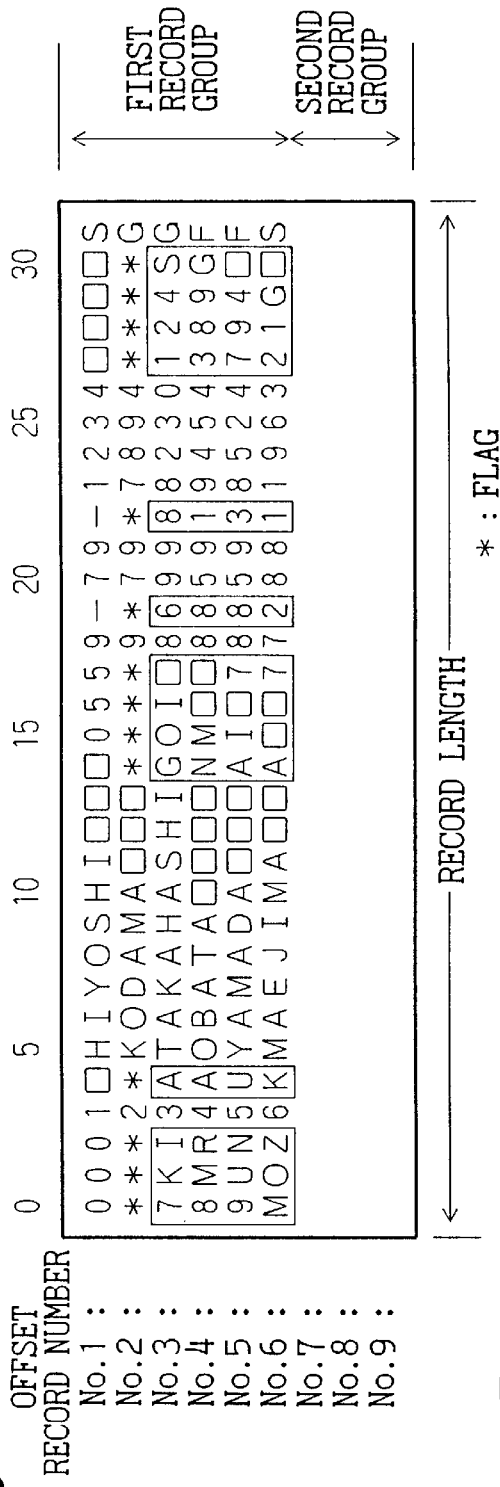
FIG. 11A is a diagram showing a first offset locations in records storing characters to be restored.
Figure 11B:
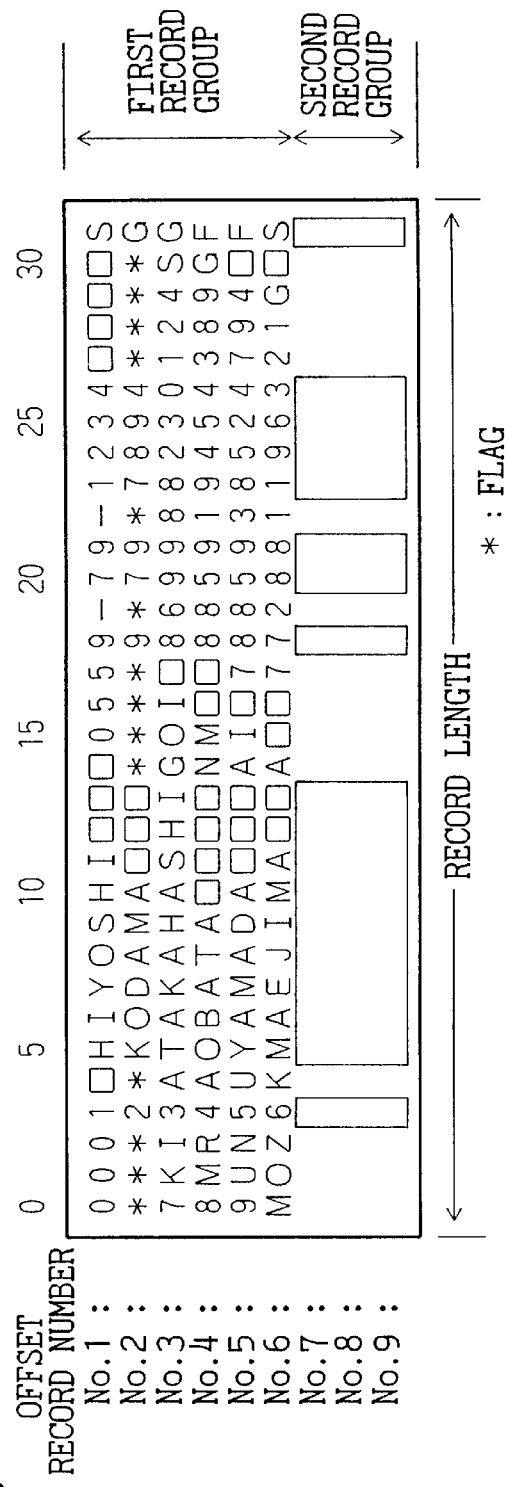
FIG. 11B is a diagram showing a second offset locations to which compressed characters stored in the first offset locations shown in FIG. 11A are to be transferred.

FIG. 11A is a diagram showing a first offset location in records storing characters to be restored, and FIG. 11B is a diagram showing a second offset location to which compressed characters stored in the first offset location shown in FIG. 11A are to be transferred for restoration. The first offset location storing characters to be restored shown in FIG. 11A corresponds to the offset location reserved as a storage area in records to be compressed shown in FIG. 9A. The second offset location reserved for transferring data shown in FIG. 11B corresponds to the offset location storing data to be transferred as shown in FIG. 8B.

Next, an embodiment of a character transferring process of a method for data restoration according to the present invention will be explained.

FIG. 12A shows a buffer in a state that characters compressed in other offset locations corresponding to the offset locations without the flags * in the second record, have been restored in the previous offset locations in the previous records. FIG. 12B shows a buffer in a state that all characters have been restored. FIG. 12A shows a data array of a buffer after transferring characters in the first offset location shown in FIG. 11A to the second offset location shown in FIG. 11B. FIG. 12B shows a data array of a buffer after copying characters in the first record and corresponding to offset locations with the flags * into the corresponding offset locations in the second to the ninth records.

Figure 13:
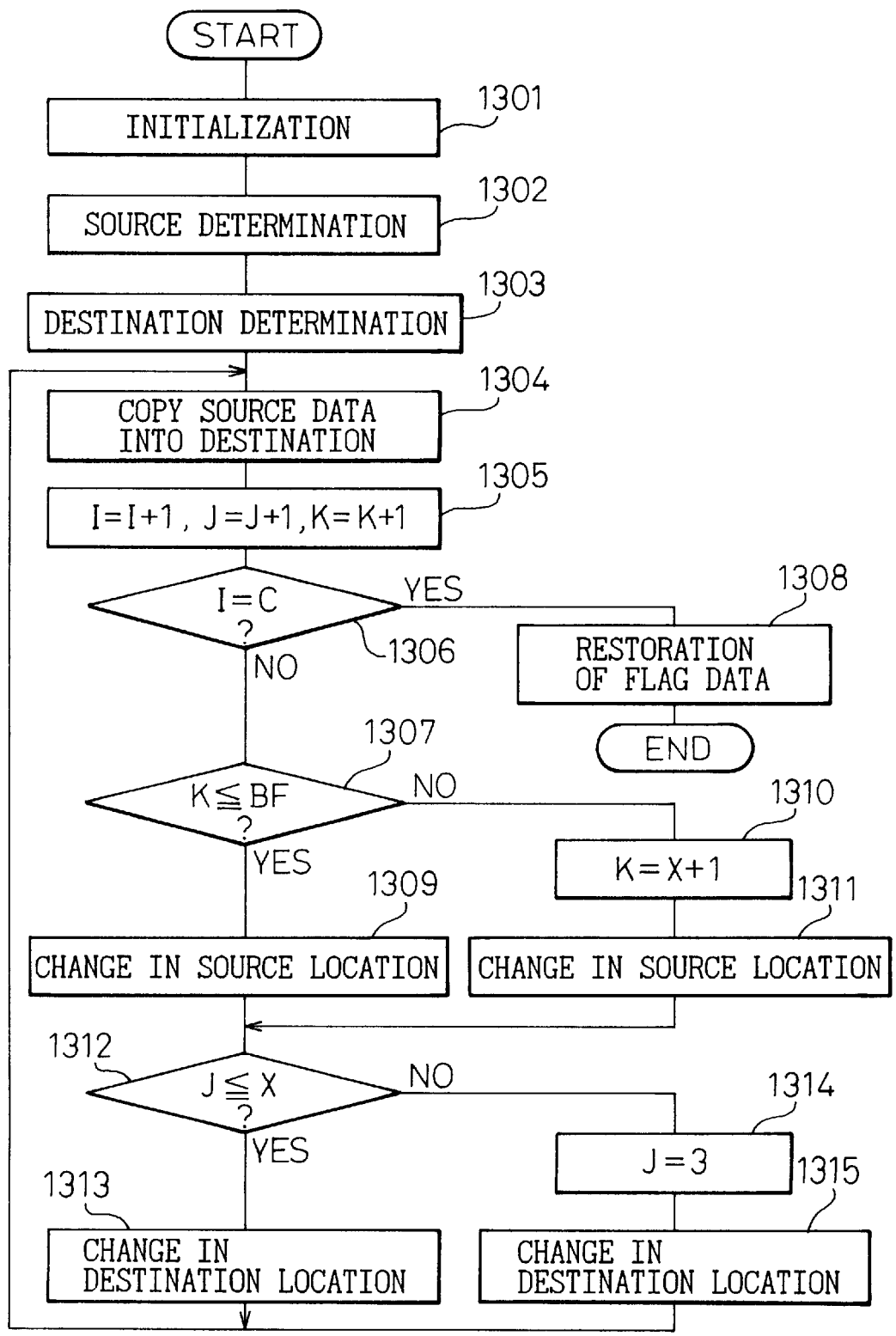
FIG. 13 is a flowchart of a buffer restoring process of an embodiment according to the present invention.

FIG. 13 is a flowchart of a method for buffer restoration of an embodiment according to the present invention. The method for buffer restoration will be explained referring to FIGS. 8A, 8B, 9A and 9B below.

First, in step 1301, initialization is executed, namely, the following are respectively set, I=0, BF=(X+Y)=9, X=6, C=(record length−number of flags)×(BF−X)=(32−14)×(9−6)=54, and a counter of a source of record J=3, a counter of a destination of record K=X+1=6+1=7, wherein I denotes a counter used for determining whether this processing routine has completed. The routine ends when the counter I counts up to the number C (=54) of characters to be transferred. BF denotes the record number after the restoration, that is 9, X denotes the record number before the restoration, that is 6, and Y=(BF−X)=9−6=3 as shown in FIG. 7.

In step 1302, offset locations in destination records K (7, 8, 9, 7, 8, 9, 7, . . . ) to be transferred are determined corresponding to offset locations without the flags * in the second record. In step 1303, offset locations in source records J (3, 4, 5, 6, 3, 4, 5, 6, . . . ) to transfer are determined corresponding to offset locations with the flags * in the second record.

In step 1304, characters in offset locations in source records J are copied in the offset locations in destination records K.

In step 1305, 1 is respectively added to I, J and K.

In step 1306, whether or not the counter I has counted up to C is checked, if the result is affirmative, the process proceeds to step 1308, and data at flag locations are restored by copying characters corresponding to offset locations with the flags * in the first record into the corresponding offset locations in the second to the ninth record in step 1308, then the process ends. If the result is negative in step 1306, the process proceeds to step 1307.

In step 1307, whether K≦BF is checked, if J≦BF, the process proceeds to step 1309, if J>BF, the process proceeds to step 1310.

In step 1309, the offset location to be transferred is changed to the same offset location in the source record K and the process proceeds to step 1312.

In step 1310, K=X+1 is calculated.

In step 1311, the offset location to be transferred is changed to the next offset location without the flags *, different from the previous offset location in the source record K and the process proceeds to step 1312.

In step 1312, whether J≦X is checked, if J≦X, the process proceeds to step 1313, if J>X, the process proceeds to step 1314.

In step 1313, the offset location to be transferred is changed to the offset location in the destination record J and the process returns to step 1304.

In step 1314, J is set to 3, then the process proceeds to step 1315.

In step 1315, the offset location to be transferred is changed to the offset location in the destination record J and the process returns to step 1304.

Steps 1304 to 1315 are repeated until I is counted up to C, namely, the process ends when I=54.

Next, a method for a sort-merge process according to the present invention will be explained referring to FIGS. 2, 14 and 15 below.

Figure 14:
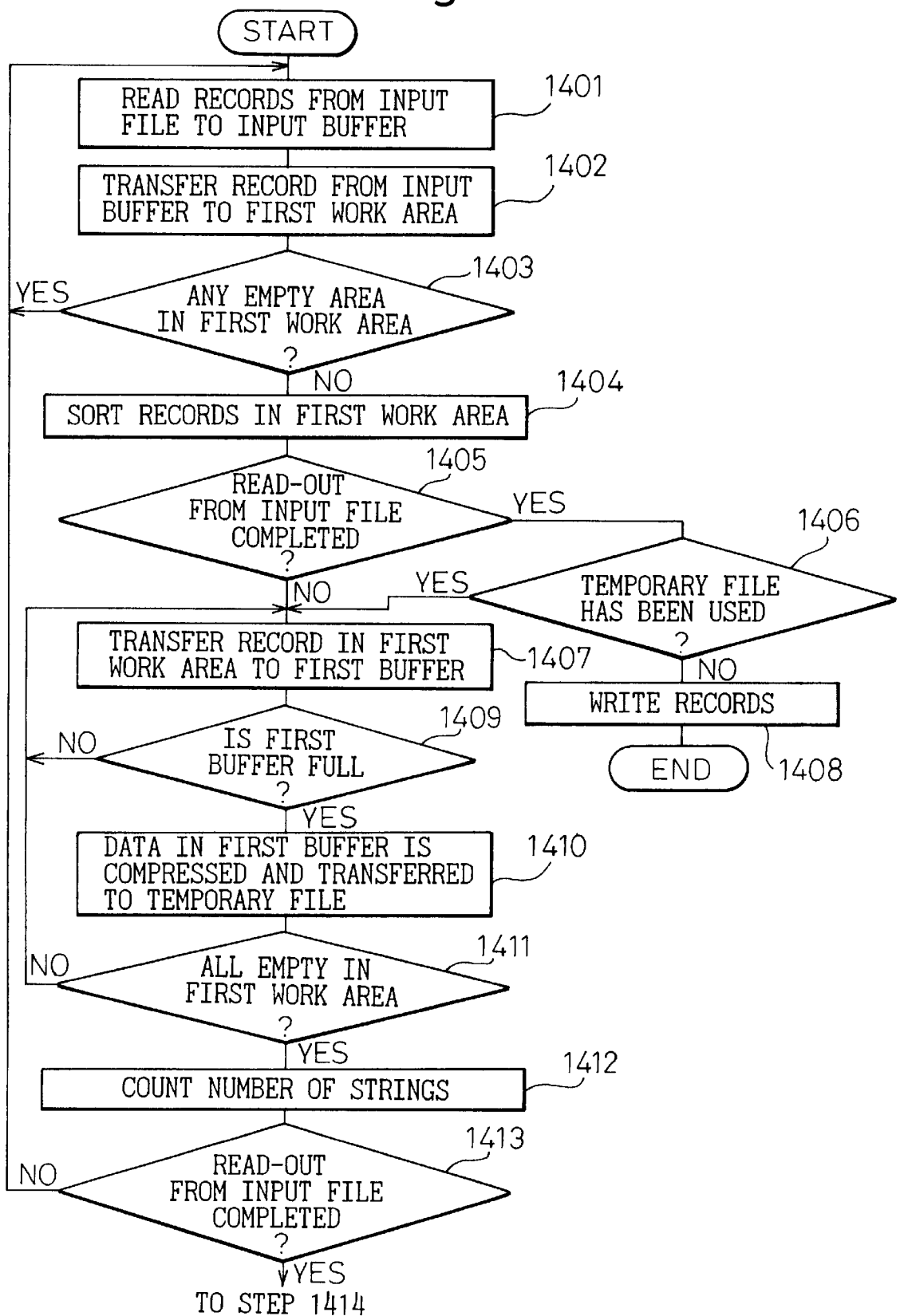
FIG. 14 is a flowchart of a sorting process of a sort-merge process according to the present invention.

FIG. 14 is a flowchart of a sorting process of the sort-merge process, and FIG. 15 is a flowchart of a merging process of the sort-merge process.

In step 1401, a plurality of records are read one by one from the input file 1 into the input buffer 2.

In step 1402, the records stored in the input buffer 2 are transferred to the first working area 3.

In step 1403, whether or not the first working area 3 includes an empty area is checked. If the first working area 3 includes the empty area, the process returns to step 1401, and repeats steps 1402 and 1403. If the first working area 3 does not include the empty area, the process proceeds to 1404, and the records in the first working area 3 are sorted in step 1404.

In step 1405, whether or not the read-out from the input file 1 has completed is checked. If it is YES, the process proceeds to step 1406, if it is NO, the process proceeds to step 1407.

In step 1406, whether or not the temporary file 5 has been used is checked. If it is YES, the process proceeds to step 1407, if it is NO, the sort-merge process proceeds to step 1408.

In step 1407, records in the first working area 3 are transferred into the first buffer 4, and the process proceeds to step 1409.

In step 1408, records sorted in the first working area 3 are written into an output file 9 via an output buffer 8, and the sort-merge process ends.

In step 1409, whether or not the first buffer 4 is full of records is checked. If it is YES, the process proceeds to step 1410, if it is NO, the process returns to step 1407, and step 1407 is repeated.

In step 1410, the first buffer 4 is compressed and the compressed records are transferred to the temporary file 5, then the process proceeds to step 1411.

In step 1411, whether or not the first working area 3 is completely free is checked. If it is YES, the process proceeds to step 1412, if it is NO, the process returns to step 1407, and step 1407 is repeated.

In step 1412, the number of the strings transferred into the temporary file 5 is counted.

In step 1413, whether or not the read-out of the records stored in the temporary input file 5 has finished is checked. If the result is YES, the process proceeds to 1414, if the result is NO, the process returns to 1401.

In step 1414, each leading block having a plurality of records in each of the strings stored in the temporary buffer 5 is respectively read into the second buffers 6a, 6b and 6c one by one.

In step 1415, the second buffers 6 are restored.

In step 1416, each leading record stored in each of the second buffers 6 is merged in the second working area 7, and the result of the merge is written into the output buffer 8.

In step 1417, records stored in the output buffer 8 are written in the output file 9.

In step 1418, whether or not all of merge processes have been completed is checked. If the result is YES, the process ends, if the result is NO, the process returns to step 1414, and steps 1414 to 1418 are repeated.

The embodiment heretofore explained only describes a method for compression and/or restoration of a file having a plurality of records each divided into a plurality of columns wherein column locations are searched for in which the same character is stored throughout the records and utilizes some of the column locations for the purpose of compression and/or restoration. The present invention can also apply to a method for compression and/or restoration of a file having a plurality of records each divided into a plurality of fields each having at least a column wherein field locations are searched in which the same characters are stored throughout the records and utilizes some of the field locations for the compression and/or restoration.

According to a method for data compression and/or restoration of the present invention, first, column locations are searched for in a plurality of records in a file in which the data is the same throughout the records, then, column locations found by the search can be used for storing the data in the other column locations in records to be excluded from the file for the purpose of compression and/or restoration, so that a plurality of data records can be compressed at one time, thus, compression efficiency can be improved.

According to a method and an apparatus for a sort-merge process of the present invention, the length of data transferred between the main memory and the auxiliary disc storage can be shortened because the data length to be transferred can be reduced due to compression. Thus, the input/output processing time can be decreased, and the disc space can be saved.

It will be understood by those skilled in the art that the foregoing descriptions are preferred embodiments of the disclosed method and apparatus, and that various changes and modifications may be made in the invention without departing from the spirit and scope thereof.

What is claimed is:

1. A method for compressing a file having a plurality of records each consisting of a plurality of columns and created in a predetermined format, comprising the steps of:

searching for one or more column locations in which the data is the same throughout the records;

calculating the number of records which can be compressed in the file based on the number of the found column locations;

determining a first record group consisting of records to be compressed and a second record group consisting of one or more records to be excluded based on the calculated number of records which can be compressed;

determining a first record from the first record group, the first record data being kept the same;

memorizing the addresses of the found column locations in a second record selected from the first record group, the second record being different from the first record; and transferring data stored in other column locations in the one or more records in the second record group to the column locations in records in the first record group except the first and the second records.

2. A storage medium for storing a program to make a computer execute the steps described in claim 1.

3. A method for compressing a file having a plurality of records each consisting of a plurality of fields each having at least a column and created in a predetermined format, comprising the steps of:

searching for one or more field locations in which the data is the same throughout the records;

calculating the number of records which can be compressed in the file based on the number of the found field locations;

determining a first record group consisting of records to be compressed and a second record group consisting of one or more records to be excluded based on the calculated number of records which can be compressed;

determining a first record from the first record group, the first record data being kept the same;

memorizing the addresses of the found field locations in a second record selected from the first record group, the second record being different from the first record; and transferring data stored in other field locations in the one or more records in the second record group to the field locations in records in the first record group except the first and the second records.

4. A storage medium for storing a program to make a computer execute the steps described in claim 2.

5. A method for restoring a compressed file to an original file having a plurality of records each consisting of a plurality of columns and created in a predetermined format and being divided into a first record group corresponding to the compressed file and a second record group to be excluded from the original file, wherein column locations in which the data is the same are searched for throughout the records in the original file, and the compressed file storing data in the found column locations in records except a first and a second records, the data in the first record kept the same, the second record being different from the first record and having been used for memorizing the addresses of the column locations before the restoration, the data having been originally stored in the other column locations in one or more records in the second record group of the original file, comprising the steps of:

transferring data stored in the column locations in the records except the first and the second records in the compressed file to other column locations in the one or more records in the second record group of the original file; and copying data stored in the column locations in the first record in the first record group, in the addresses of the column locations in the one or more records in the second record group and the second records in the first record group.

6. A storage medium for storing a program to make a computer execute the steps described in claim 3.

7. A method for restoring a compressed file to an original file having a plurality of records each consisting of a plurality of fields each having at least a column and created in a predetermined format and being divided into a first record group corresponding to the compressed file and a second record group to be excluded from the original file, wherein field locations in which the data is the same are searched for throughout the records in the original file, and the compressed file storing data in the found field locations in records except a first and a second records, the data in the first record kept the same, the second record being different from the first record and having been used for memorizing the addresses of the found field locations before the restoration, the data having been originally stored in the other field locations in one or more records in the second record group of the original file, comprising the steps of:

transferring data stored in the field locations in the records except the first and the second records in the compressed file to other field locations in the one or more records in the second record group of the original file; and copying data stored in the field locations in the first record in the first record group, in the addresses of the field locations in the one or more records in the second record group and the second record in the first record group.

8. A storage medium for storing a program to make a computer execute the steps described in claim 4.

9. An apparatus for sort-merging a plurality of records in an input file stored in a storage device, comprising:

input means for inputting the records from the storage device to a memory one by one;

a work area for in-memory sorting, said work area having a limited size large enough to receive and sort a predetermined block of records at a time from said input means;

sorting means for sorting each block of records as a unit in accordance with a determined key as each block is received in said work area;

a first buffer storing each block of sorted records;

compression means for compressing each block of sorted records stored in said first buffer;

first data transferring means for transferring each block of compressed records from said first buffer to a temporary file in the storage device;

second data transferring means for transferring the compressed records from the temporary file to the memory;

restoration means for restoring the compressed records;

a plurality of second buffers in the memory for storing the restored records, said second buffers being different from the first buffer;

merging means for merging the plurality of restored records and generating a string of records; and output means for outputting the string of records to an output file in the storage device.

10. A method for sort-merging a plurality of records in an input file stored in a storage device, comprising:

inputting the records from the storage device to a memory one by one, the memory including a work area having a limited size large enough to receive and sort a predetermined block of records at a time from said input means;

sorting each block of records as a unit in accordance with a determined key as each block is received in said work area;

storing each block of sorted records in a first buffer;

compressing each block of sorted records stored in the first buffer;

transferring each block of compressed records from the first buffer to a temporary file in the storage device;

transferring the compressed records from the temporary file to the memory;

restoring the compressed records;

storing the restored records in a plurality of second buffers in the memory, the second buffers being different from the first buffer;

merging the plurality of restored records and generating a string of records; and outputting the string of records to an output file in the storage.

11. A storage medium for storing a program to make a computer execute the steps described in claim 10.

12. A method for sort-merging a plurality of records in an input file stored in a storage device, comprising:

a first step for inputting the records from the storage device to a memory one by one, the memory including a work area having a size not large enough to sort all the records for sort-merging to be input to the memory;

a second step for sorting a determined number of input records as a unit in accordance with a determined key;

a third step for storing the sorted record group in a first buffer;

a fourth step for compressing the record group stored in the first buffer, the record group having a plurality of records each consisting of a plurality of columns and created in a predetermined format, comprising:

searching for one or more column locations in which the data is the same throughout the records, calculating the number of records which can be compressed in the file based on the number of the found column locations, determining a first record group consisting of records to be compressed and a second record group consisting of one or more records to be excluded based on the calculated number of records which can be compressed, determining a first record from the first record group, the first record data being kept the same, memorizing the addresses of the found column locations in a second record selected from the first record group, the second record being different from the first record, and transferring data stored in other column locations in the one or more records in the second record group to the column locations in records in the first record group except the first and the second records;

a fifth step for transferring the compressed record group from the first buffer to a temporary file in the storage;

a sixth step for transferring the record group from the temporary file to the memory;

a seventh step for restoring the transferred record group;

an eighth step for storing the restored records in a plurality of buffers in the memory, the buffers being different from the first buffer;

a ninth step for merging the plurality of restored record groups and generating a string of records; and a tenth step for outputting the string of records to an output file in the storage.

13. A method for sort-merging a plurality of records in an input file stored in a storage device, comprising:

a first step for inputting the records from the storage device to a memory one by one, the memory including a work area having a size not large enough to sort all the records for sort-merging to be input to the memory;

a second step for sorting a determined number of input records as a unit in accordance with a determined key;

a third step for storing the sorted record group in a first buffer;

a fourth step for compressing the record group stored in the first buffer;

a fifth step for transferring the compressed record group from the first buffer to a temporary file in the storage;

a sixth step for transferring the record group from the temporary file to the memory;

a seventh step for restoring the transferred record group, wherein the seventh step utilizes a method for restoring a compressed file to an original file having a plurality of records each consisting of a plurality of columns and created in a predetermined format and being divided into a first record group corresponding to the compressed file and a second record group to be excluded from the original file, wherein column locations in which the data is the same are searched for throughout the records in the original file, and the compressed file storing data in the found column locations in records except a first and a second records, the data in the first record kept the same, the second record being different from the first record and having been used for memorizing the addresses of the column locations before the restoration, the data having been originally stored in the other column locations in one or more records in the second record group of the original file, comprising:

transferring data stored in the column locations in the records except the first and the second records in the compressed file to other column locations in the one or more records in the second record group of the original file, and copying data stored in the column locations in the first record in the first record group, in the addresses of the column locations in the one or more records in the second record group and the second record in the first record group;

an eighth step for storing the restored records in a plurality of buffers in the memory, the buffers being different from the first buffer;

a ninth step for merging the plurality of restored record groups and generating a string of records; and a tenth step for outputting the string of records to an output file in the storage.

14. A method for sort-merging a plurality of records in an input file stored in a storage device, comprising:

a first step for inputting the records from the storage device to a memory one by one, the memory including a work area having a size not large enough to sort all the records for sort-merging to be input to the memory;

a second step for sorting a determined number of input records as a unit in accordance with a determined key;

a third step for storing the sorted record group in a first buffer;

a fourth step for compressing the record group stored in the first buffer, the record group having a plurality of records each consisting of a plurality of fields each having at least a column and created in a predetermined format, comprising:

searching for one or more field locations in which the data is the same throughout the records, calculating the number of records which can be compressed in the file based on the number of the found field locations, determining a first record group consisting of records to be compressed and a second record group consisting of one or more records to be excluded based on the calculated number of records which can be compressed, determining a first record from the first record group, the first record data being kept the same, memorizing the addresses of the found field locations in a second record selected from the first record group, the second record being different from the first record, and transferring data stored in other column locations in the one or more records in the second record group to the field locations in records in the first record group except the first and the second records;

a fifth step for transferring the compressed record group from the first buffer to a temporary file in the storage;

a sixth step for transferring the record group from the temporary file to the memory;

a seventh step for restoring the transferred record group;

an eighth step for storing the restored records in a plurality of buffers in the memory, the buffers being different from the first buffer;

a ninth step for merging the plurality of restored record groups and generating a string of records; and a tenth step for outputting the string of records to an output file in the storage.

15. A method for sort-merging a plurality of records in an input file stored in a storage device, comprising:

a first step for inputting the records from the storage device to a memory one by one, the memory including a work area having a size not large enough to sort all the records for sort-merging to be input to the memory;

a second step for sorting a determined number of input records as a unit in accordance with a determined key;

a third step for storing the sorted record group in a first buffer;

a fourth step for compressing the record group stored in the first buffer;

a fifth step for transferring the compressed record group from the first buffer to a temporary file in the storage;

a sixth step for transferring the record group from the temporary file to the memory;

a seventh step for restoring the transferred record group, wherein the seventh step utilizes a method for restoring a compressed file to an original file having a plurality of records each consisting of a plurality of fields each having at least a column and created in a predetermined format and being divided into a first record group corresponding to the compressed file and a second record group to be excluded from the original file, wherein field locations in which the data is the same are searched for throughout the records in the original file, and the compressed file storing data in the found field locations in records except a first and a second records, the data in the first record kept the same, the second record being different from the first record and having been used for memorizing the addresses of the found field locations before the restoration, the data having been originally stored in the other field locations in one or more records in the second record group of the original file, comprising:

- transferring data stored in the field locations in the records except the first and the second records in the compressed file to other field locations in the one or more records in the second record group of the original file, and
- copying data stored in the field locations in the first record in the first record group, in the addresses of the field locations in the one or more records in the second record group and the second record in the first record group;
- an eighth step for storing the restored records in a plurality of buffers in the memory, the buffers being different from the first buffer;
- a ninth step for merging the plurality of restored record groups and generating a string of records; and
- a tenth step for outputting the string of records to an output file in the storage.

16. An apparatus for sorting and merging a plurality of records in an input file, said apparatus comprising:

- sorting means for sorting each of a plurality of initial record groups as a unit, one initial record group at a time, to generate corresponding sorted record groups, each initial record group consisting of a predetermined number of records of the input file;
- compression/restoration means for compressing each sorted record group, one sorted record group at a time, to be transferred to a temporary file in storage and for restoring each compressed and sorted record group, one compressed and sorted record group at a time, each compressed and sorted record group having been previously sorted and compressed for storage; and
- merging means for merging each restored record group with other sorted record groups to generate a string of records.

17. A method for sorting and merging a plurality of records in an input file, the method comprising:

- sorting each of a plurality of initial record groups as a unit, one initial record group at a time, to generate corresponding sorted record groups, each initial record group consisting of a predetermined number of records of the input file;
- compressing each sorted record group, one sorted record group at a time, to be transferred to a temporary file in storage;
- restoring each compressed and sorted record group, one compressed and sorted record group at a time, each compressed and sorted record group having been previously sorted and compressed for storage; and
- merging each restored record group with other sorted record groups to generate a string of records.

18. A computer-readable medium encoded with a program for sorting and merging a plurality of records in an input file, said program comprising procedures for:

- sorting each of a plurality of initial record groups as a unit, one initial record group at a time, to generate corresponding sorted record groups, each initial record group consisting of a predetermined number of records of the input file;
- compressing each sorted record group, one sorted record group at a time, to be transferred to a temporary file in storage;
- restoring each compressed and sorted record group, one compressed and sorted record group at a time, each compressed and sorted record group having been previously sorted and compressed for storage; and
- merging each restored record group with other sorted record groups to generate a string of records.

* * * * *